(12) United States Patent
Yamada et al.

(10) Patent No.: US 6,563,214 B2
(45) Date of Patent: May 13, 2003

(54) ELECTRONIC COMPONENT AND METHOD OF MANUFACTURING THE SAME

(75) Inventors: Hiroyuki Yamada, Fukui (JP); Takeshi Iseki, Fukui (JP); Yasuharu Kinoshita, Fukui (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/917,313

(22) Filed: Jul. 27, 2001

(65) Prior Publication Data

US 2002/0076536 A1 Jun. 20, 2002

(30) Foreign Application Priority Data

Jul. 28, 2000 (JP) ........................................ 2000-228603

(51) Int. Cl.⁷ ................................................. H05K 7/02
(52) U.S. Cl. ........................ 257/730; 257/698; 257/774; 257/786; 174/255; 174/260; 361/760; 361/765; 361/768; 338/307; 338/308; 338/311; 338/312; 338/313; 338/328
(58) Field of Search ................................ 174/250, 255, 174/257, 260; 361/768, 773, 774, 760, 765; 257/786, 774, 698, 730; 338/307, 308, 311, 312, 313, 328

(56) References Cited

U.S. PATENT DOCUMENTS

| 3,185,947 | A | * | 5/1965 | Freymodsson | |
|---|---|---|---|---|---|
| 3,964,087 | A | * | 6/1976 | Mallon | 338/206 |
| 5,388,029 | A | * | 2/1995 | Moriyama | 361/760 |
| 5,729,437 | A | * | 3/1998 | Hashimoto | 361/760 |
| 5,966,052 | A | * | 10/1999 | Sakai | 331/68 |
| 6,201,290 | B1 | * | 3/2001 | Yamada | 257/536 |
| 6,238,992 | B1 | * | 5/2001 | Yamada | 438/382 |

FOREIGN PATENT DOCUMENTS

JP 11-068284 3/1999

* cited by examiner

*Primary Examiner*—Cathy Lam
(74) *Attorney, Agent, or Firm*—RatnerPrestia

(57) ABSTRACT

An electronic component having a substrate on which one or more grooves are formed on its opposing side faces; electrodes formed on the groove and top and bottom faces of the substrate at a portion adjacent to the groove; and a circuit element formed between the electrodes. An electrode is also formed on the opposing side faces of said substrate at a portion other than the grooves. This structure enables to improve the reliability of a soldered portion even for small electronic components with about 10 μm thick electrodes such as chip resistors, chip capacitors, and chip inductors.

7 Claims, 8 Drawing Sheets

ELECTRONIC COMPONENT AND METHOD OF MANUFACTURING THE SAME

FIELD OF THE INVENTION

The present invention relates to a terminal structure of electronic components for electronic appliances and a method of manufacturing the electronic components.

BACKGROUND OF THE INVENTION

Japanese Patent Laid-open Publication No. H11-68284 discloses conventional chip electronic components which have improved reliability with respect to a portion soldered onto a circuit board.

FIG. 8 is a sectional view of a connecting portion of the conventional electronic component soldered onto the circuit board. As shown in FIG. 8, electrode 2 is formed on both side faces of electronic component 1, and two or more protrusions and recesses are provided on soldered portion 7 of electrode 2. Electronic component 1 is bonded onto land 4 on electronic circuit board 3 by solder 5, and solder 5 forms solder fillet 6.

Next, a conventional method of manufacturing the above chip electronic component which has improved reliability with respect to the soldered portion is described.

After forming electrode 2 on both side faces of electronic component 1, two or more protrusions and recesses 8 of 0.1 mm to 0.2 mm square are formed on soldered portion 7 of electrode 2. These protrusions and recesses 8 are processed on electrode 2 by etching for electronic components having electrode 2 less than 1 mm square, and by electric spark machining for those having electrode 2 above 1 mm square. The electronic component of the prior art thus improves reliability between land 4 and soldered portion 7 by forming protrusions and recesses 8.

The conventional chip electronic component as configured and manufactured above allows the improvement of reliability as described below.

When solder fillet 6 formed after soldering is exposed to repeated heating and cooling, the numerous 0.1 mm square to 0.2 mm square protrusions and recesses 8 formed on the surface of soldered portion 7 allow stress to be dissipated over the whole of soldered portion 7. This avoids the concentration of any stress on a limited area such as between land 4 and bottom face of electrode 2 or between land 4 and solder fillet 6. Stress concentration can thus be reduced by absorbing stress by the entire soldered portion 7. Accordingly, the reliability of soldered portion 7 is improved.

The conventional chip electronic component forms multiple 0.1 mm square to 0.2 mm square protrusions and recesses 8 on the surface of electrode 2. However, these protrusions and recesses for reducing stress concentration on electrode 2 surface cannot be formed on electronic components whose electrodes are only about 10 µm thick, such as chip resistors and chip capacitors.

The present invention thus aims to improve the reliability of the soldered portion even for small electronic components having electrodes only about 10 µm thick.

SUMMARY OF THE INVENTION

An electronic component of the present invention has a substrate on which one or more grooves are formed on its opposing side faces; electrodes formed on the groove and top and bottom faces of the substrate at a portion adjacent to the groove; and a circuit component formed between these electrodes. Side electrodes are also formed on the opposing side faces of the substrate at a portion other than the groove. This structure of the present invention enables to improve the reliability of a soldered area on small electronic components with electrodes only about 10 µm thick such as chip capacitors and chip inductors.

BRIEF DESCRIPTION OF THE DRAWINGS

FIG. 1 (b) is a side view of the thick film chip resistor in accordance with the preferred embodiment of the present invention.

DESCRIPTION OF PREFERRED EMBODIMENTS

A preferred embodiment of the present invention is described next, taking a thick film chip resistor (for power use) as an example, with reference to drawings.

Figure 1A:
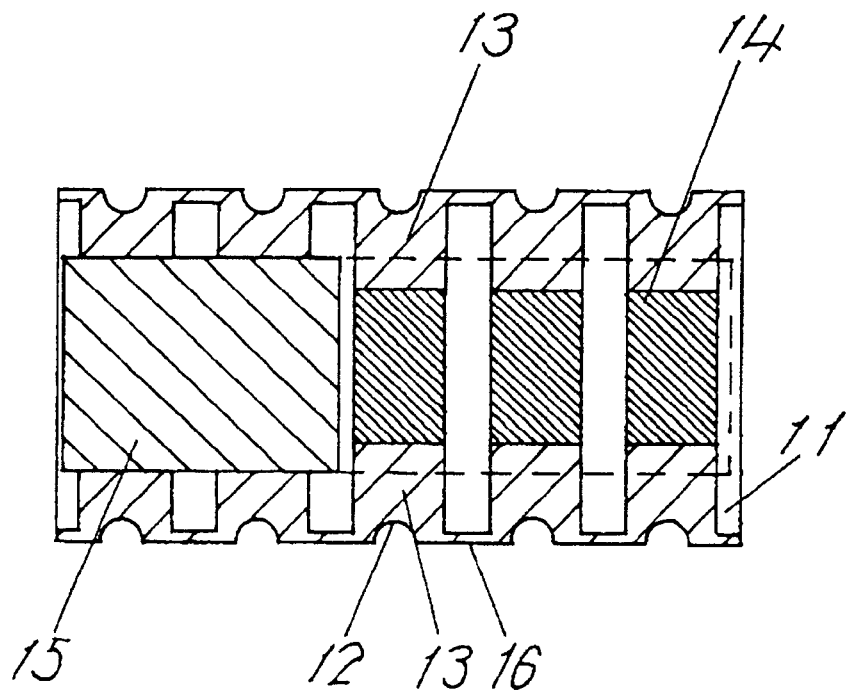
FIG. 1 (a) is a plan view of a thick film chip resistor in accordance with a preferred embodiment of the present invention.
Figure 1B:
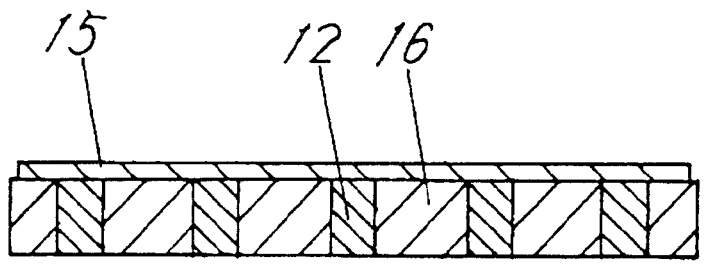

FIG. 1 (a) is a plan view of a thick film chip resistor in the preferred embodiment of the present invention. FIG. 1 (b) is a side view of the same thick film chip resistor. In FIGS. 1 (a) and 1 (b), two or more grooves 12, semicircular in cross section, are formed on opposing longer-side faces of alumina substrate 11. Outer dimensions of substrate 11 in this preferred embodiment are 6.4×3.2 mm. The resistor of the preferred embodiment achieves a rated power of 1 W.

Electrode 13 is continuously formed on grooves 12 on opposing side faces of substrate 11 and top and bottom faces of substrate 11 adjacent to grooves 12. Circuit element 14 made of resistor element is connected between electrodes 13 on the top face of substrate 11. In the present embodiment, five circuit elements 14 are formed in parallel. Protective coating 15, made of epoxy resin, is formed so as to cover these circuit elements 14. Side electrode 16 is formed at portions other than grooves 12 on the opposing side faces of substrate 11. A nickel layer is formed on the surface of exposed electrodes 13 and side electrodes 16, and then a solder layer is formed on the nickel layer to improve the solderability in component mounting (not illustrated in FIGS. 1 (a) and 1 (b)).

A method of manufacturing the thick film chip resistor as configured above is described next.

Figure 2:
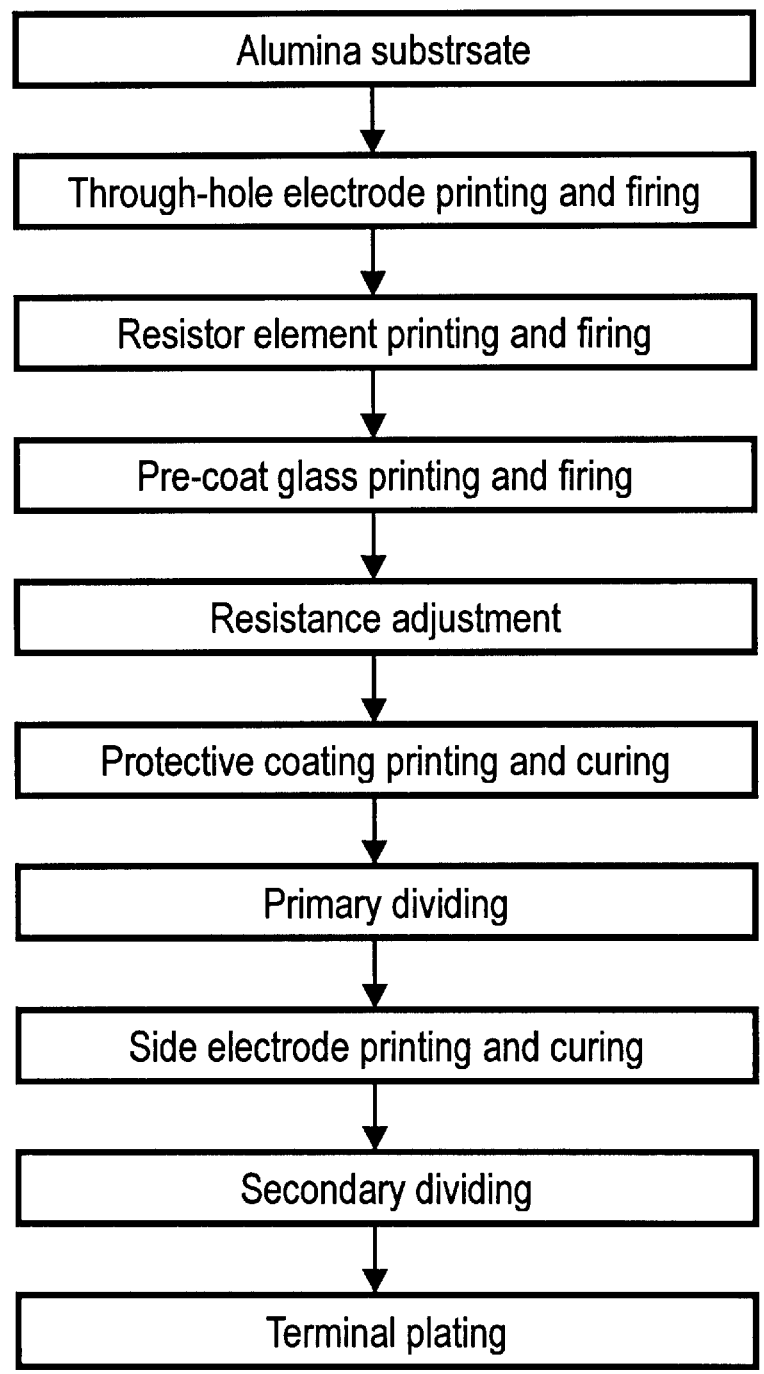
FIG. 2 is a process flow chart of the thick film chip resistor in accordance with the preferred embodiment of the present invention.

FIG. 2 is a process flow chart for the thick film chip resistor in the preferred embodiment of the present invention. FIGS. 3 to 7 are plan views of substrate 11 and the finished resistor in each process. Each manufacturing process is detailed next with reference to FIGS. 3 to 7.

Figure 3A:
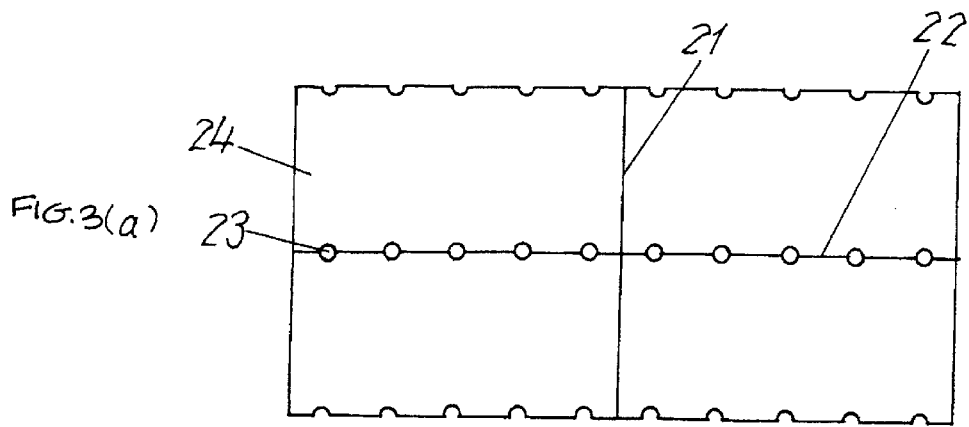
FIGS. 3 (a) and 3 (b) are plan views of the thick film chip resistor in accordance with the preferred embodiment of the present invention at each manufacturing process.
Figure 3B:
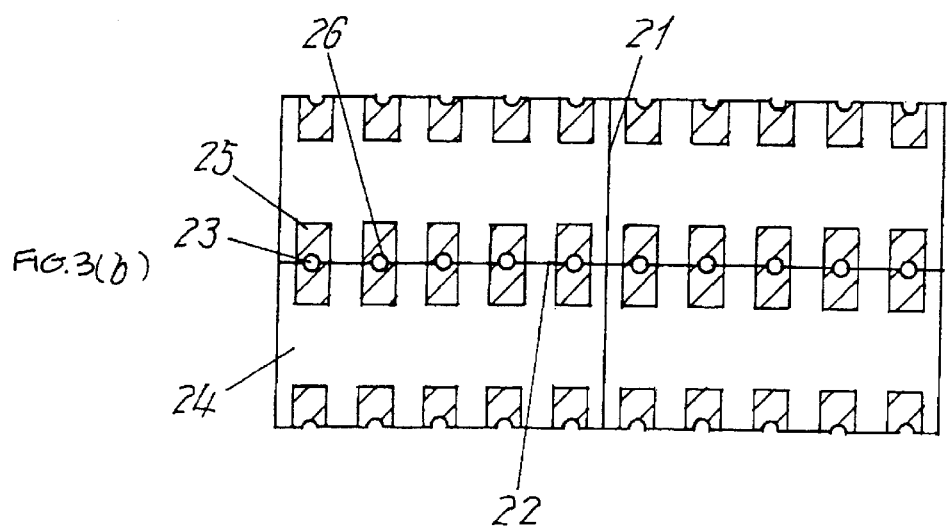

As shown in FIG. 3 (a), alumina substrate 24 is first prepared. This alumina substrate 24 has splitting grooves 21 and 22 which divide alumina substrate 24 containing 96% alumina into predetermined dimensions (6.4×3.2 mm) for manufacturing a plurality of thick film chip resistors simultaneously. Round through-holes 23 are formed along splitting grooves 22 which will be the longer side when alumina substrate 24 is divided into single thick film chip resistors. The diameter of through-hole 23 is 0.3 mm. FIG. 3 (a) illustrates only four portions for thick film chip resistors. However, usually, one sheet of substrate is designed to manufacture hundreds to thousands of thick film chip resistors simultaneously.

Next, as shown in FIG. 3 (b), silver conductive paste is printed on each through-hole 23 from the surface of substrate 24, and conductive paste creeps into each through-hole 23. Substrate 24 is then fired at 850° C. to form top electrode 25 and an electrode on the inner wall of the through-holes 23. In the same way, silver conductive paste is printed on each through-hole 23 from the bottom face of substrate 24, and conductive paste creeps into through-holes 23 from the bottom side. The substrate 24 is fired again at 850° C. to form the bottom electrode (not illustrated) and an electrode on the inner wall of the through-holes.

In general, the section of through-hole 23 is round, allowing conductive paste to be applied uniformly on the inner wall of through-hole 23. Through-hole electrode 26 is thus formed by printing into through-holes as described above. The through-hole electrode may also be formed on through-holes having a rectangular cross section or rectangular through-holes with round corners. In this case, however, the reliability may degrade due to the occurrence of cracking on the through-hole electrode because the paste tends to be applied thicker locally at corners.

Figure 4A:
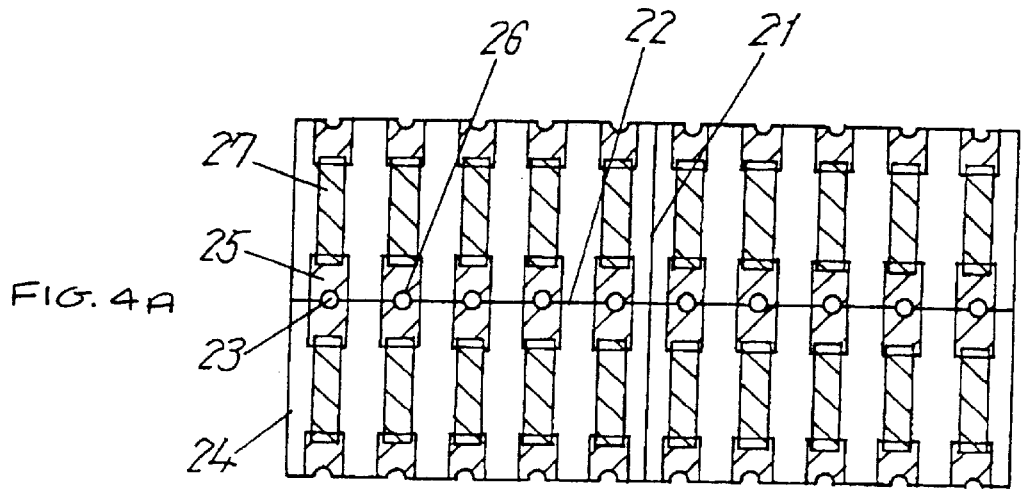
FIGS. 4 (c) and 4 (d) are plan views of the thick film chip resistor in accordance with the preferred embodiment of the present invention at each manufacturing process.
Figure 4B:
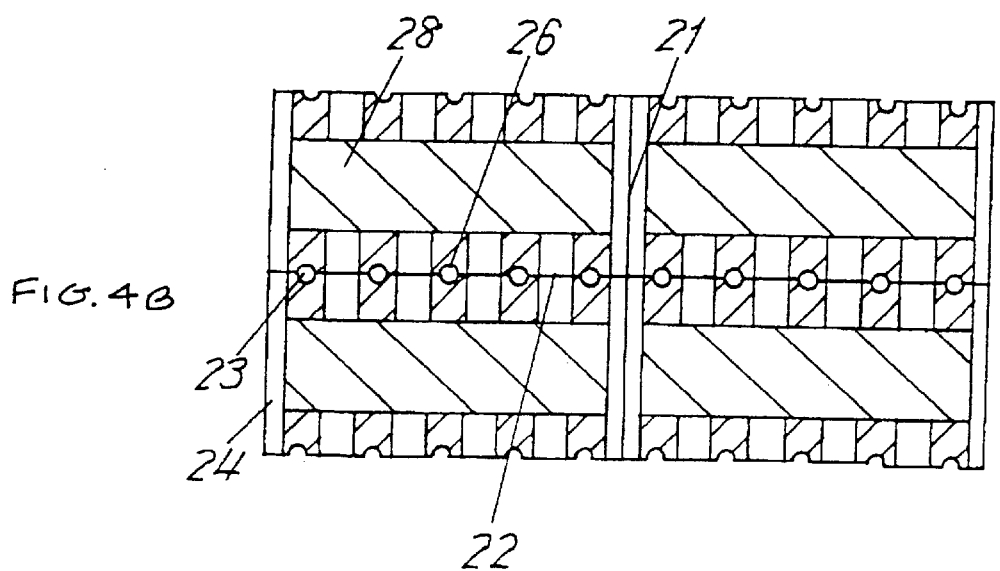

Next, as shown in FIG. 4 (a), resistor paste containing ruthenium oxide is screen printed between a pair of top electrodes 25. The substrate 24 is then fired at 850° C. to form individual circuit elements 27 made of resistor element.

Next, as shown in FIG. 4 (b), pre-coating glass paste is screen printed on circuit elements 27 between top electrodes 25 to cover circuit elements 27 and to facilitate trimming. The substrate 24 is fired at 600° C. to form pre-coat glass layer 28.

Figure 5A:
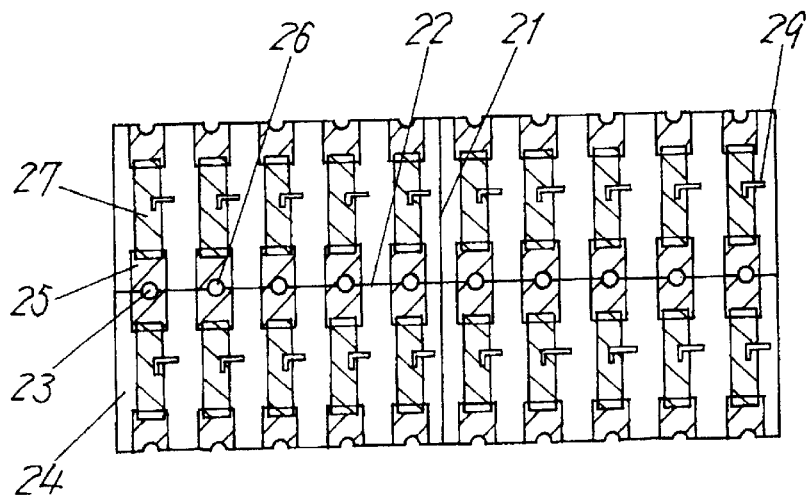
FIGS. 5 (a) and 5(b) are plan views of the thick film chip resistor in accordance with the preferred embodiment of the present invention at each manufacturing process.
Figure 5B:
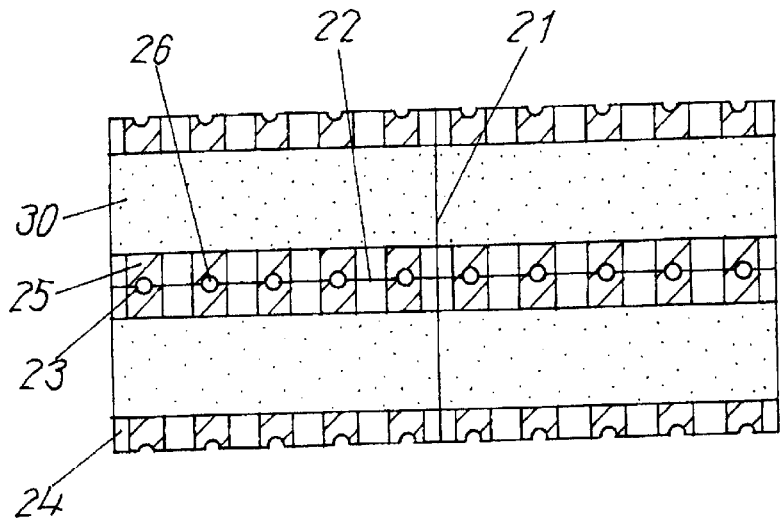

Next, as shown in FIG. 5 (a), trimming groove 29 is provided on circuit elements 27 covered with pre-coat glass layer (not illustrated), such as by YAG laser beam, to adjust to a predetermined resistance.

Next, as shown in FIG. 5 (b), epoxy resin paste is screen printed as a protective coating to cover a part of top electrodes 25 and entire circuit elements 27. The epoxy resin paste is cured at 200° C. to form protective coating 30 in each resistor area.

Figure 6A:
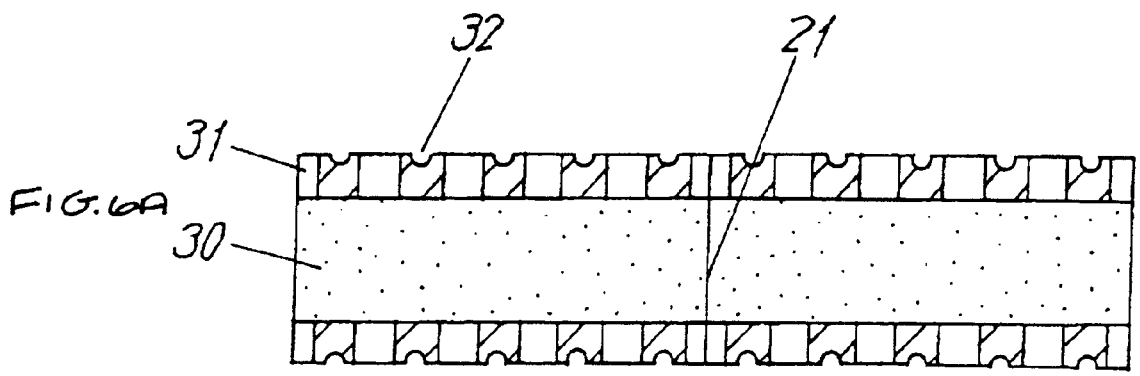
FIGS. 6 (a) and 6 (b) are plan views of the thick film chip resistor in accordance with the preferred embodiment of the present invention at each manufacturing process.
Figure 6B:
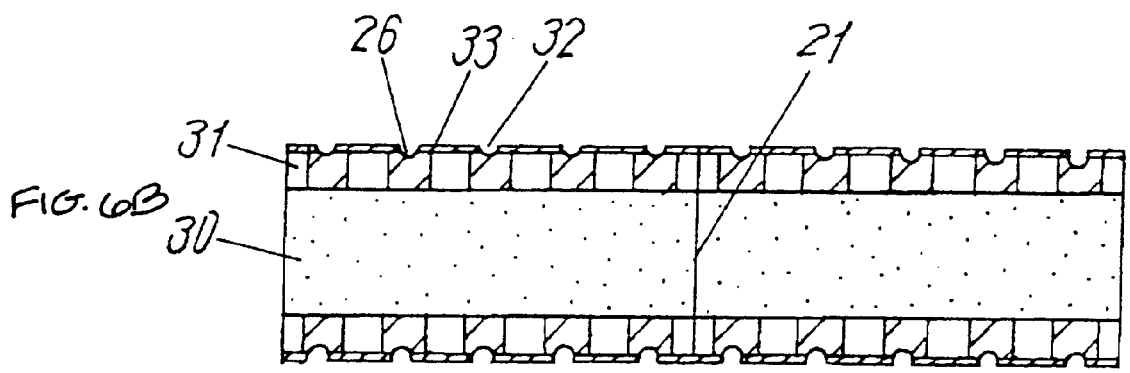

Next, as shown in FIG. 6 (a), substrate 24 is primarily divided along splitting groove 22 into alumina substrate strips 31. Grooves 32, semicircular in cross section, are created on opposing side faces 37 of substrate strip 31 by dividing substrate 24 along splitting grooves 22.

Next, as shown in FIG. 6 (b), conductive resin paste is applied to side face 37 using a roller, and cured at 150 to 200° C. to form side electrode 33.

Conductive resin paste is applied using the roller so as not to bury through-hole electrode 26 formed in grooves 32. If excess conductive resin paste is applied, to the extent of burying through-hole electrode 26 in grooves 32, the paste film is too thick to allow the complete evaporation of the solvent it contains, interfering with the formation of a dense electrode. This prevents the achievement of expected strength of the side electrode 33.

If conductive resin paste is transferred using the roller to form side electrode 33, as in this preferred embodiment, through-hole electrode 26 is not buried, enabling the formation of a uniformly thin side electrode 33.

Burring (protrusion) exists on side face 37 of substrate strip 31 as a result of cutting silver through-hole electrode 26 formed in grooves 32 in addition to the unevenness of substrate strip 31 itself. In order to ensure application of conductive paste onto the rough substrate surface to expand the electrode area, transfer printing of conductive resin paste using the roller is an effective means for forming side electrodes easily and inexpensively.

Figure 7A:
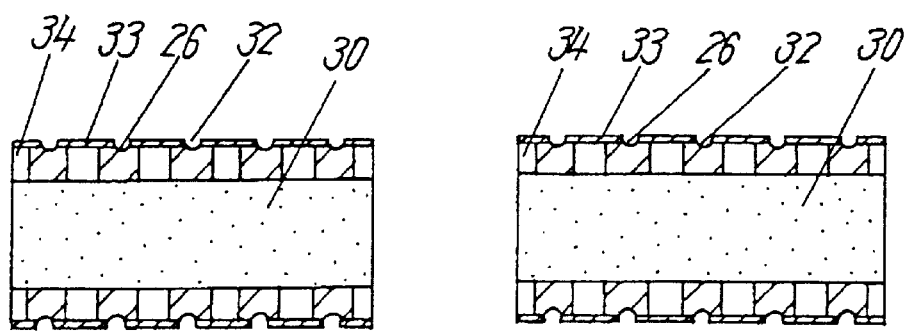
FIGS. 7 (a) and 7 (b) are plan views of the thick film chip resistor in accordance with the preferred embodiment of the present invention at each manufacturing process.
Figure 7B:
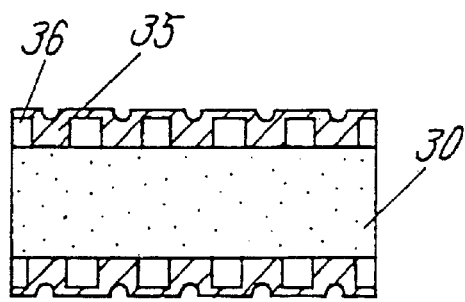
Figure 8:
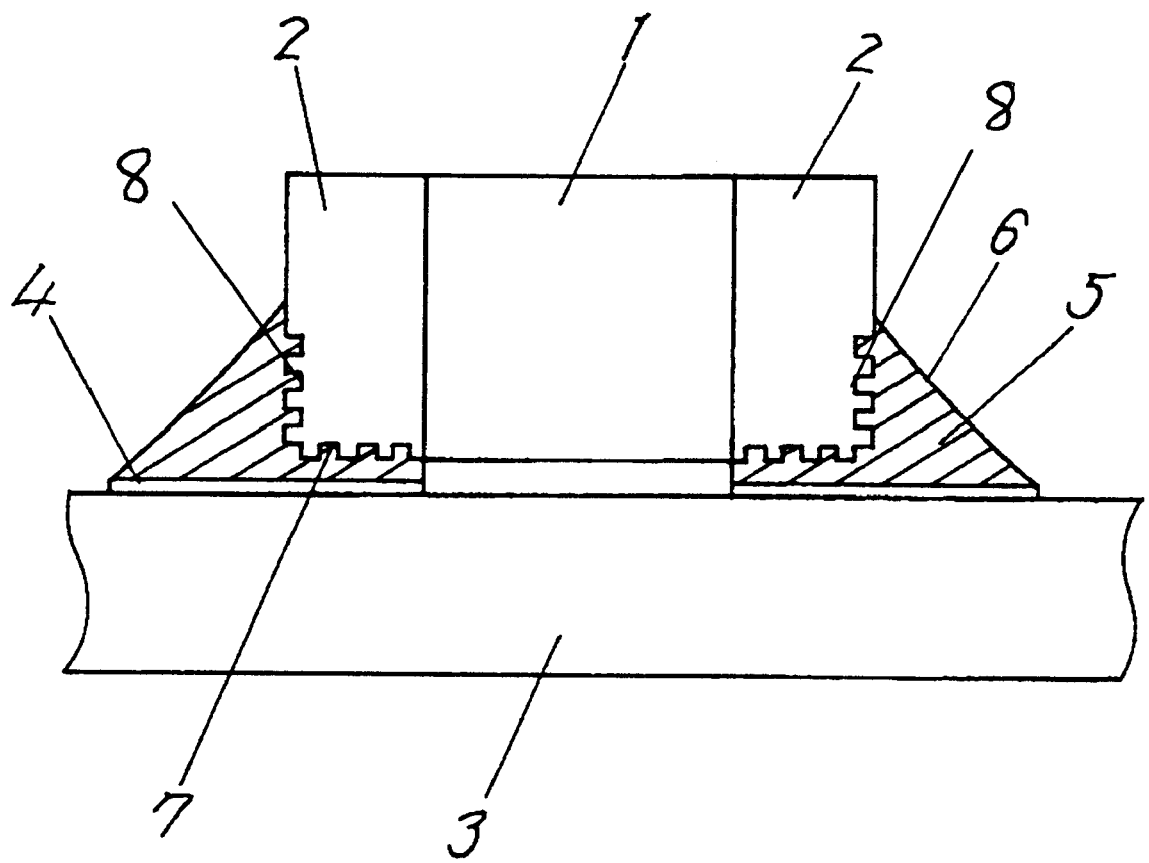
FIG. 8 is a sectional view of a portion of the conventional electronic component soldered onto a circuit board.

Next, as shown in FIG. 7 (a), individual thick film chip resistors 34 are obtained by secondarily dividing the substrate along splitting grooves 21.

Lastly, as shown in FIG. 7 (b), a nickel layer (base layer) and solder layer 35 are electroplated on the surface of exposed top electrode 25, through-hole electrode 26, bottom electrode (not illustrated), and side electrode 33 to complete thick film chip resistor 36.

The thick film chip resistor as manufactured above is mounted and soldered onto a circuit board, and its reliability is evaluated by the air-heating and air-cooling type heat shock test (a test to keep the test pieces at −55° C. for 30 minutes and +125° C. for 30 minutes alternately and repeatedly). The change in resistance between lands on the circuit board where the resistor is mounted is measured, and the test pieces are judged to have connection failure when the measured resistance varies by 5% or more.

For comparison, a general thick film chip resistor of 6.4×3.2 mm, the same size as that of the preferred embodiment, with an electrode formed on a shorter side (3.2 mm) of the substrate is prepared as Comparative example 1. For Comparative example 2, the preferred embodiment of the present invention without grooves on the side face of a 6.4 mm side is prepared so that electrodes are formed linearly. Result of this test showed that variation in resistance exceeding 5% due to degradation of the soldered portion occurs in Comparative example 1 after 1200 cycles, and in Comparative example 2 after 2000 cycles. In contrast, none of the thick film chip resistor test pieces in the present embodiment showed failure exceeding 5% resistance change, even after 3000 cycles.

As described above, the present embodiment forms electrodes 13 in grooves 12 on opposing side faces on the longer side of substrate 11 and top and bottom faces of substrate 11 at portions adjacent to grooves 12. In addition, side electrodes 16 are formed on opposing side faces of substrate 11 at portions other than grooves 12. This makes the side electrode area larger, and enables to improve bonding strength of the electrode onto the substrate. Improved bonding strength eliminates cracking of the soldered portion, even if stress is generated by the difference in coefficient of thermal expansion between, for example, the chip resistor and circuit board onto which the chip resistor is soldered in the heat shock test. In other words, in the present enbodiment, electrodes having protrusions and recesses on side faces of substrate 11, i.e. electrode 13 and side electrode 16, enable the entire soldered portion to absorb and thus dissipate stress. This results in improved reliability of the soldered portion, even for electronic components having only 10 μm-thick electrodes such as thick film chip resistors and chip capacitors.

In the above preferred embodiment, circuit elements 14 consisting of five resistor elements are formed in parallel. This enables heat to be uniformly distributed over the entire thick film chip resistor when heat is generated as a result of applying an electrical load, compared to a circuit component consisting of only one resistor element. Furthermore, the enlarged electrode made by forming electrode 13 on the entire side face of the longer side of substrate 11 including grooves 12 and side electrode 16 improves heat dissipation to the circuit board.

In other words, the electrode structure of the present invention provides extremely effective heat dissipation for large thick film chip resistors for high power rating use.

A cross section of grooves 12 in the present embodiment is semicircular. This also reduces stress concentration, and further improves electrode strength.

In the present embodiment, the electrode area may be enlarged by making the area of electrode 13 formed on grooves 12 on the opposing side faces of substrate 11 and top and bottom faces of substrate 11 at portions adjacent to grooves 12 equivalent to or larger than the area of side electrodes 16 formed on the opposing side faces of substrate 11 at portions other than grooves 12. This also improves electrode strength.

Furthermore, the present embodiment forms side electrode 33 by transfer printing conductive resin paste using the roller so as not to bury through-hole electrodes 26. This enables side electrode 33 to be uniformly and thinly formed, achieving the formation of a dense side electrode 33.

The present embodiment refers to the thick film chip resistor in which circuit element 14 consists of a resistor element, but it is apparent that circuit element 14 is not limited to a resistor element. The same improved reliability with respect to the soldered portion is achieved for other chip components such as chip capacitors, chip inductors, and their composite components using a capacitor component or inductance component as circuit element 14.

The present embodiment also refers to circuit element 14 consisting of five resistor elements individually connected between electrodes 13. On the other hand, one resistor element may be connected between several pairs of electrodes. However, as previously indicated, this structure is not preferable with respect to reliability because heat is generated locally when an electrical load is applied.

The present embodiment also refers to the formation of top electrode 25 and bottom electrode (not illustrated) using silver conductive paste, and side electrode 33 using resin conductive paste. It is apparent that materials and manufacturing conditions in each process are not limited to those in the present embodiment. For example, silver conductive paste (high temperature firing type) may be used for forming the side electrode, or nickel or copper may be used with thin film deposition methods such as sputtering, vacuum deposition, and CVD for forming the side electrode.

As described above, the electronic component of the present invention comprises side electrodes formed at portions other than grooves on the opposing side faces of the substrate where one or more grooves are provided on its opposing side face. This enlarges the electrode bonding area and makes it possible to improve the electrode strength. Stress is thus dissipated by making the entire soldered portion to absorb the stress. Accordingly, the reliability of the soldered portion is improved even for electronic components with about 10 μm thick electrodes such as chip resistors and chip capacitors.

What is claimed is:

1. An electronic component comprising:
   a substrate having at least one groove on each of its opposing two side faces;
   an electrode on said groove and top and bottom faces of said substrate at a portion adjacent to said groove; and
   a circuit element formed between said electrodes on top and bottom faces of said substrate,
   wherein said electrode extends continuously along said each of said opposing two side faces of said substrate at a portion other than said groove.

2. The electronic component as defined in claim 1, wherein a cross section of said groove is semicircle.

3. The electronic component as defined in claim 1, wherein an area of said electrode formed on said groove and said top and bottom faces of said substrate is not smaller than an area of said electrode formed on said opposing two side faces of said substrate at a portion other than said groove.

4. The electronic component as defined in claim 1, wherein said electronic component is a resistor.

5. The electronic component as defined in claim 1, wherein said electronic component is a capacitor.

6. The electronic component as defined in claim 1, wherein said electronic component is an inductor.

7. The electronic component as defined in claim 1, wherein said electronic component is a composite component.

* * * * *